United States Patent
Ochiai et al.

(10) Patent No.: US 11,765,872 B2
(45) Date of Patent: Sep. 19, 2023

(54) ELECTROMAGNETIC WAVE SHIELDING HOUSING, INVERTER PART, AIR CONDITIONER PART, AND AUTOMOTIVE PART

(71) Applicant: SUMITOMO BAKELITE CO., LTD., Tokyo (JP)

(72) Inventors: Yuki Ochiai, Tokyo (JP); Shunsuke Mochizuki, Tokyo (JP); Shu Okasaka, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 17/786,056

(22) PCT Filed: Nov. 19, 2020

(86) PCT No.: PCT/JP2020/043207
§ 371 (c)(1),
(2) Date: Jun. 16, 2022

(87) PCT Pub. No.: WO2021/131439
PCT Pub. Date: Jul. 1, 2021

(65) Prior Publication Data
US 2023/0045717 A1 Feb. 9, 2023

(30) Foreign Application Priority Data
Dec. 24, 2019 (JP) .................... 2019-232496

(51) Int. Cl.
*H05K 9/00* (2006.01)

(52) U.S. Cl.
CPC ................ *H05K 9/0045* (2013.01)

(58) Field of Classification Search
CPC ..................................... H05K 9/0045
See application file for complete search history.

(56) References Cited

U.S. PATENT DOCUMENTS

| 5,864,088 | A | * | 1/1999 | Sato | ............ H05K 1/0233 174/391 |
| 5,900,789 | A | | 5/1999 | Yamamoto et al. | |
| 2015/0337105 | A1 | * | 11/2015 | Takahashi | ............ H05K 9/0088 428/688 |

(Continued)

FOREIGN PATENT DOCUMENTS

| JP | 61-166998 A | 7/1986 |
| JP | 5-59587 A | 3/1993 |

(Continued)

OTHER PUBLICATIONS

International Search Report dated Feb. 16, 2021, issued in counterpart International Application No. PCT/JP2020/043207 (2 pages).

*Primary Examiner* — Hung V Ngo
(74) *Attorney, Agent, or Firm* — WHDA, LLP (57) ABSTRACT

A housing (121) having an electromagnetic shielding property includes a resin molded body (101), which is a cured product of a thermosetting resin composition, and a plating layer (103) provided on a surface of the resin molded body (101) (cured product), in which the plating layer (103) includes a Cu layer (first plating layer (105)), and a thickness of the Cu layer (first plating layer (105)) is 2 μm or more and 30 μm or less.

15 Claims, 2 Drawing Sheets

(56) References Cited

U.S. PATENT DOCUMENTS

2020/0128704 A1* 4/2020 Liu .................... H05K 1/0216
2021/0289615 A1* 9/2021 Ishioka ................ B32B 27/18
2022/0064402 A1* 3/2022 Koda .................... H01L 21/56

FOREIGN PATENT DOCUMENTS

| JP | 7-286280 A | 10/1995 |
| JP | 10-41706 A | 2/1998 |
| JP | 2018-58960 A | 4/2018 |

* cited by examiner

FIG. 4

ELECTROMAGNETIC WAVE SHIELDING HOUSING, INVERTER PART, AIR CONDITIONER PART, AND AUTOMOTIVE PART

TECHNICAL FIELD

The present invention relates to an electromagnetic wave shielding housing, an inverter part, an air conditioner part, and an automotive part, which are formed by a cured product of a thermosetting resin composition.

BACKGROUND ART

In recent years, many products and parts, which were made of metal, are more and more coming to be made of plastic (that is, resin molded products) from the viewpoint of weight reduction and the like. Plating processes are applied to such products, parts, and the like from the viewpoints of weather resistance, design, and the like. Various techniques were proposed for plating processes of products made of resin. For example, Patent Document 1 (Japanese Unexamined Patent Publication No. 2018-58960) describes a technique which attempts to improve adhesion between a thermosetting resin molded body and a plating film. This document describes a resin composition for sealing which contains an epoxy resin, a phenol compound, and an aromatic monocarboxylic acid having a specific electron-withdrawing functional group and that it is possible for a sealing material produced using the above composition to have high adhesion to a plated lead frame at high temperatures.

In addition, Patent Document 2 (Japanese Unexamined Patent Publication No. H5-59587) is another example describing a method for plating plastics. The above document describes mixing calcium carbonate fine particles with a particle diameter of 10 μm or less into resins for which plating is difficult, such as polyethylene resin and polypropylene resin, to carry out molding and then processing the molded product by a normal ABS resin plating step, including a chemical etching process, and that, due to this, it is possible to use the normal ABS resin plating step and equipment as they are to adhere a plating layer to PA or PP resin or the like, for which plating is difficult.

RELATED DOCUMENT

Patent Document

[Patent Document 1] Japanese Unexamined Patent Publication No. 2018-58960
[Patent Document 2] Japanese Unexamined Patent Publication No. H5-59587

SUMMARY OF THE INVENTION

Technical Problem

As described above, as products and parts come to be made of plastics instead of metals, it is now clear that there is still room for improvement in the electromagnetic wave shielding property (also called "electromagnetic wave shielding performance").

Solution to Problem

An aspect of the present invention is an electromagnetic shielding housing including a cured product of a thermosetting resin composition, and a plating layer provided on the surface of the cured product, in which the plating layer includes a Cu layer, and a thickness of the Cu layer is 2 μm or more and 30 μm or less.

Another aspect of the present invention is an electromagnetic wave shielding housing including a cured product of a thermosetting resin composition, and a plating layer laminated on a surface of the cured product, in which an electromagnetic wave shielding performance of a structure of the cured product and the plating layer is 40 dB or more at a frequency of 10 MHz.

Another aspect of the present invention is an inverter part including the electromagnetic wave shielding housing described above.

Another aspect of the present invention is an air conditioner part including the electromagnetic wave shielding housing described above.

Another aspect of the present invention is an automotive part including the electromagnetic wave shielding housing described above.

Advantageous Effects of Invention

According to the present invention, it is possible to improve the electromagnetic wave shielding property of a housing formed of a resin molded body.

DESCRIPTION OF EMBODIMENTS

A description will be given below of embodiments of the present invention using drawings. In all drawings, similar constituent elements are marked with common reference numerals and explanation thereof will not be repeated as appropriate. Unless otherwise noted, "A to B" in a numerical range represents A or more and B or less and includes the numerical values at both ends. In addition, in the present embodiment, it is possible for the composition to include each component alone or in a combination of two or more.

A description will be given below in order of (1) a housing subjected to a plating process and having an electromagnetic wave shielding property, (2) a phenol resin composition of a housing, and (3) a plating layer, and furthermore, a description will be given of (4) specific adhesion of a plating layer using a blending example of a phenol resin composition, and (5) the electromagnetic wave shielding properties according to Examples.

In addition, regarding the electromagnetic wave shielding property, a description will be given below of the three types of an electric field wave shielding property (electric field wave: 10 MHz to 1000 MHz), a magnetic field wave shielding property (magnetic field wave: 10 MHz to 1000 MHz), and an electromagnetic field wave shielding property (electromagnetic field wave: 1000 MHz to 6000 MHz).

(Housing Subjected to Plating Process and Having Electromagnetic Wave Shielding Property)

Figure 1:
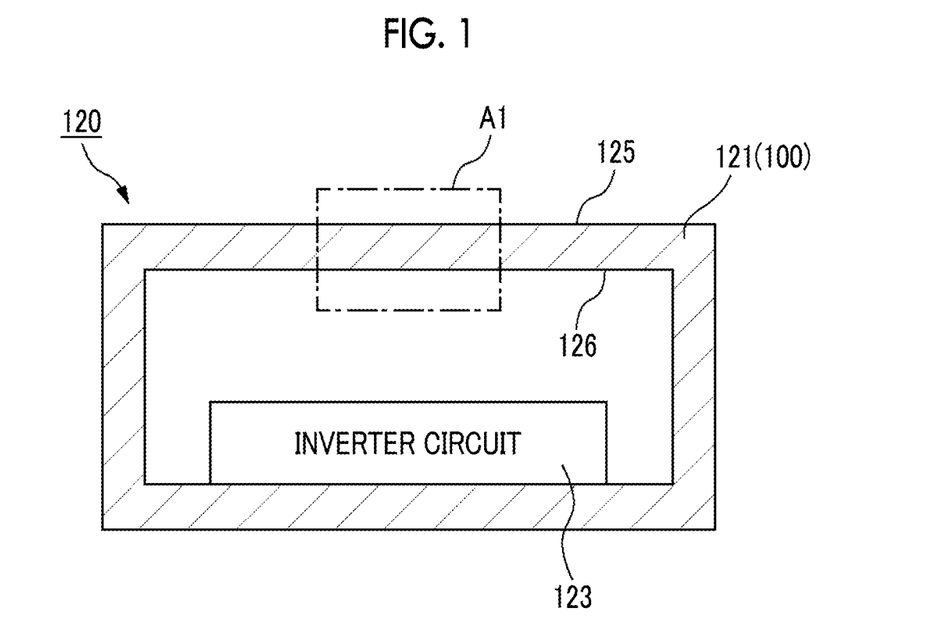
FIG. 1 is a cross-sectional view showing a configuration example of a molded body in an embodiment.

In the present embodiment, an inverter part 120 is illustrated as an example of a product (including parts) in which a housing (a molded body 100) subjected to a plating process and having an electromagnetic wave shielding property is used, but the present invention is not limited thereto. In addition, use is also possible for other products and parts for which there is a demand for a high shielding property with respect to electromagnetic waves, such as, for example, air-conditioner parts and vehicle parts.

FIG. 1 is a cross-sectional view showing a schematic configuration of the inverter part 120. The inverter part 120 is provided with a housing 121 and an inverter circuit 123 provided in an inner part of the housing 121.

The housing 121 is, for example, box-shaped and the inverter circuit 123 is stored in an inner part thereof. At this time, the entire surface of the housing 121 is covered with a plating layer 103. Accordingly, the electromagnetic waves emitted by the inverter circuit 123 in the inner part of the housing 121 are blocked by the housing 121 covered by the plating layer 103 having an electromagnetic wave shielding property. As a result, the leakage of electromagnetic waves emitted by the inverter circuit 123 to the outside is greatly suppressed. In addition, since external electromagnetic waves are blocked from penetrating into an inner part of the inverter part 120, it is possible to eliminate the adverse influence of external electromagnetic waves on the inverter circuit 123.

Figure 2:
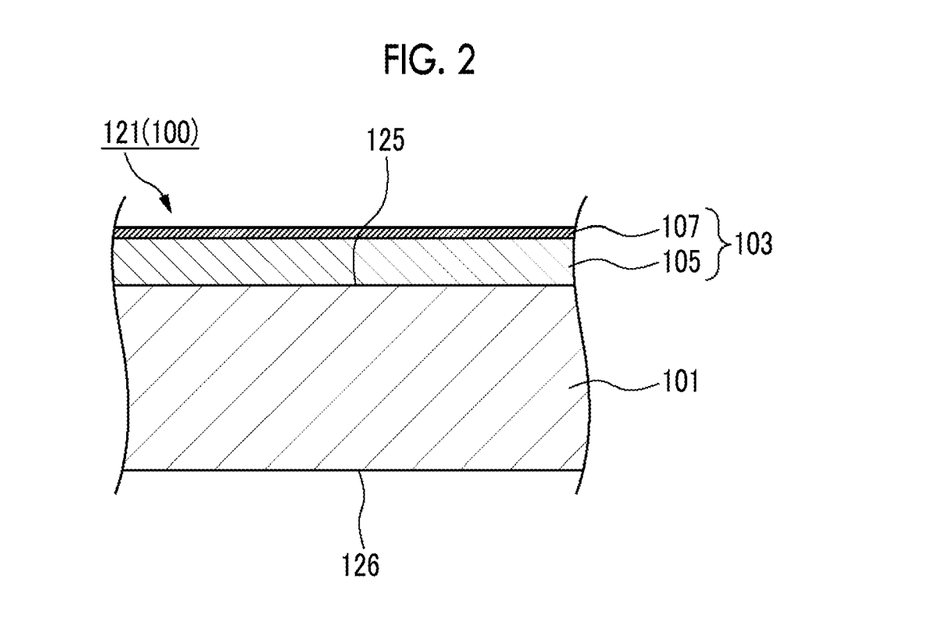
FIG. 2 is an enlarged view of a partial region of a housing of FIG. 1.

FIG. 2 is an enlarged view of a partial region A1 of the housing 121 of FIG. 1. As shown, in a cross-sectional structure, the housing 121 is provided with a resin molded body 101 of the housing body and the plating layer 103 formed on one surface of the resin molded body 101 (here, an outer surface 125 of the housing 121). The resin molded body 101 is, for example, a cured product of a phenol resin composition. The plating layer 103 is provided with a first plating layer 105 and a second plating layer 107 from the resin molded body 101 side.

First, a description will be given below of the phenol resin composition (thermosetting resin composition), followed by description of the plating layer 103.

(Thermosetting Resin Composition)

A thermosetting resin composition (also referred to below simply as "resin composition" as appropriate) is a resin composition which is used for a resin molded body for which a plating process is applied on a surface and which includes the following components (A) and (B).

(A) Thermosetting resin
(B) Core-shell-type elastomer particles

In the present embodiment, the resin composition is specifically a thermosetting resin composition.

A description will be given below of the constituent components of the resin composition with specific examples.

(Component (A))

Component (A) is a thermosetting resin.

The component (A) may be, for example, any component used as a molding material and specific examples thereof include a phenol resin, an epoxy resin, a urea (urea) resin, a resin having a triazine ring such as a melamine resin, a bismaleimide resin, an unsaturated polyester resin, a polyurethane resin, a diallyl phthalate resin, a silicone resin, a cyanate ester resin, a polyimide resin, a polyamide-imide resin, a benzocyclobutene resin, a resin having a benzoxazine ring, a polyvinyl butyral resin, and a polyvinyl acetate resin.

The component (A) more specifically includes one or more selected from epoxy resins and phenol resins, preferably includes a phenol resin, and is more preferably a phenol resin, or an epoxy resin and a phenol resin. In addition, the resin composition is preferably a phenol resin composition.

(Phenol Resins)

Examples of phenol resins include novolac resins obtained by condensation or co-condensation under an acidic catalyst of phenols such as phenol, cresol, resorcinol, catechol, bisphenol A, bisphenol F, phenylphenol, aminophenol, α-naphthol, β-naphthol, and dihydroxynaphthalene, with formaldehyde or ketones, including phenol novolac resins and cresol novolac resins; phenol aralkyl resins having a phenylene skeleton synthesized from the phenols described above and dimethoxyparaxylene or bis (methoxymethyl) biphenyl; phenol aralkyl resins such as phenol aralkyl resins having a biphenylene skeleton; and phenol resins having a trisphenylmethane skeleton.

The phenol resin preferably includes one or two or more selected from the group consisting of resol-type phenol resins and novolac-type phenol resins.

From the viewpoint of improving adhesion to the plating film formed on the surface of the resin molded body, the component (A) more preferably includes a resol-type phenol resin and a novolac-type phenol resin, and is even more preferably a resol-type phenol resin and a novolac-type phenol resin.

Among the above, including the resol-type phenol resin in the component (A) makes it possible to improve the adhesion to the plating film formed on the surface of the resin molded body, to moderately increase the cross-link density of the resin molded body, to improve the toughness of the resin molded body, and to improve the mechanical strength. In addition, since it is possible to moderately improve the cross-link density in this manner, it is possible to efficiently suppress dimensional changes in the resin molded body due to water and moisture absorption.

It is possible to obtain resol-type phenol resins, for example, by reacting phenols and aldehydes in the presence of a basic catalyst, usually at a molar ratio of aldehydes with respect to phenols (aldehydes/phenols) of 1.3 to 1.7.

Here, examples of the phenols used when manufacturing resol-type phenol resins include one or two or more phenol compounds selected from the group consisting of phenol, o-cresol, m-cresol, p-cresol, xylenol, alkylphenols, catechol, and resorcinol.

In addition, examples of aldehydes used when manufacturing resol-type phenol resins include aldehyde compounds such as formaldehyde, paraformaldehyde, and benzaldehyde, substances which are the sources generating these aldehyde compounds, or solutions of these aldehyde compounds.

From the viewpoint of improving the heat resistance of the resin molded body and from the viewpoint of suppressing dimensional changes in the resin molded body due to water and moisture absorption, when the component (A) includes a resol-type phenol resin, the content thereof is more than 0% by mass with respect to the entire component (A) included in the resin composition, preferably 50% by mass or more, more preferably 60% by mass or more, even more preferably 70% by mass or more, and yet more preferably 75% by mass or more.

In addition, from the viewpoint of suppressing dimensional changes in the resin molded body due to heating, the content of the resol-type phenol resin is 100% by mass or less with respect to the entire component (A) included in the resin composition, preferably 95% by mass or less, more preferably 90% by mass or less, even more preferably 85% by mass or less, and yet more preferably 80% by mass or less.

In addition, the component (A) including a novolac-type phenol resin makes it possible to improve the adhesion to the plating film formed on the surface of the resin molded body and to improve the mechanical strength of the resin molded body.

Examples of the novolac-type phenol resin include phenol novolac resin, cresol novolac resin, and bisphenol novolac resin.

From the viewpoint of increasing the adhesion to the plating film formed on the surface of the resin molded body as well as increasing the mechanical strength of the resin molded body, the novolac-type phenol resin preferably includes one or two or more resins selected from the group consisting of the resin represented by General Formula (1) and the resin represented by General Formula (2).

(1)

(In General Formula (1), $R^1$ each independently represents a hydrogen atom, a hydroxyl group, an alkyl group having 1 to 10 carbon atoms, a cycloalkyl group having 1 to 10 carbon atoms, or an aryl group or a substituted aryl group having 6 to 10 carbon atoms, $R^2$ each independently represents a hydrogen atom, an alkyl group having 1 to 10 carbon atoms, a cycloalkyl group having 1 to 10 carbon atoms, or an aryl group or substituted aryl group having 6 to 10 carbon atoms, and l is a number of 1 or more and 10 or less.)

For example, it is possible to appropriately select the resins shown in General Formula (1) from resins obtained by reacting phenols with aldehydes, for example, without a catalyst or in the presence of an acidic catalyst, in accordance with the application. More specifically, it is possible to use a random novolac-type or high-ortho novolac-type phenol resin as the resin shown in General Formula (1).

Usually, it is possible to obtain this novolac-type phenol resin by carrying out the reaction while controlling the molar ratio (aldehydes/phenols) of the aldehydes with respect to the phenols to be 0.7 to 0.9.

Specific examples of phenols used when preparing the resin shown in General Formula (1) include phenol, o-cresol, m-cresol, p-cresol, xylenol, alkylphenols, catechol, and resorcinol.

In addition, examples of aldehydes used when preparing the resin shown in General Formula (1) include aldehyde compounds such as formaldehyde, paraformaldehyde, and benzaldehyde, substances which are the sources generating these aldehyde compounds, or solutions of these aldehyde compounds.

(2)

(In General Formula (2), $R^1$ each independently represents a hydrogen atom, a hydroxyl group, an alkyl group having 1 to 10 carbon atoms, a cycloalkyl group having 1 to 10 carbon atoms, or an aryl group or substituted aryl group having 6 to 10 carbon atoms, $R^2$ each independently represents a hydrogen atom, an alkyl group having 1 to 10 carbon atoms, a cycloalkyl group having 1 to 10 carbon atoms, or an aryl group or a substituted aryl group having 6 to 10 carbon atoms, group X is a divalent group selected from the groups represented by General Formulas (3) to (5), m is a number of 1 or more and 10 or less, and n is a number of 1 or more and 10 or less.)

(3)

(4)

(5)

(In General Formulas (3) to (5), $R^3$ are each independently a hydrogen atom, an alkyl group having 1 to 10 carbon atoms, or a cycloalkyl group having 1 to 10 carbon atoms.)

As specific examples of the method for preparing the resin shown in General Formula (2), for the benzene-modified phenol resin corresponding to a case where $R^3$ in General Formula (3) to (5) are all hydrogen atoms, preparation is possible by reacting para-xylene dimethyl ether with phenols in the presence of an acidic catalyst, for example. In addition, in a case of a substituted benzene-modified phenol resin in which $R^3$ in General Formulas (3) to (5) corresponds to an alkyl group with 1 to 10 carbon atoms or a cycloalkyl group with 1 to 10 carbon atoms, preparation is possible by first reacting substituted benzene with aldehydes in the presence of an acidic catalyst and then reacting the obtained polymer with phenols or phenols and aldehydes with an acidic catalyst.

In this manner, it is possible to intercalate a structural unit derived from benzene or substituted benzene in the repeating units of the novolac-type phenol resin.

Although the terminal structural unit is not shown in General Formula (2), such a structural unit may be both a structural unit derived from phenols and a structural unit derived from benzene or substituted benzene.

In addition, the modification ratio of the resin shown in General Formula (2) is defined as the ratio of n with respect to the sum of m and n in General Formula (2), that is, the value of (n/(m+n)). It is possible to appropriately adjust this modification ratio according to the usage application or the like; however, from the viewpoint of controlling the cross-link density to be moderate when producing a resin molded body from the resin composition, the modification ratio is, for example, 0.15 or more, and preferably 0.20 or more, and, for example, 0.60 or less, and preferably 0.50 or less.

Specific examples of phenols used when preparing the resin shown in General Formula (2) include phenol, o-cresol, m-cresol, p-cresol, xylenol, alkylphenols, catechol, resorcinol, and the like. These phenols may be used alone or in a mixture of two or more.

As aldehydes used when preparing the resins shown in General Formula (2), for example, it is possible to use aldehyde compounds such as formaldehyde, paraformaldehyde, and benzaldehyde, substances which are sources generating these aldehyde compounds, solutions of these aldehyde compounds, and the like. These aldehydes may be used alone or in a mixture of two or more.

In addition, examples of substituted benzene used when preparing the resin shown in General Formula (2) include toluene, xylene, mesitylene, and cyclohexylbenzene.

When preparing the resin shown in General Formula (2), due to a high ease of availability, benzene, or toluene or xylene among the substituted benzenes described above, is employed and, as the phenols, a phenol in which all $R^1$ groups are hydrogen atoms is employed to prepare a benzene-modified novolac-type phenol resin, a toluene-modified novolac-type phenol resin, or a xylene-modified novolac-type phenol resin and it is preferable to use the above as the resin shown in General Formula (2).

From the viewpoint of making the processability of the resin molded body preferable, when the component (A) includes a novolac-type phenol resin, the content thereof is more than 0% by mass with respect to the entire component (A) included in the resin composition, preferably 5% by mass or more, more preferably 10% by mass or more, even more preferably 15% by mass or more, and yet more preferably 20% by mass or more.

In addition, from the viewpoint of improving the mechanical strength of the resin molded body, the content of the novolac-type phenol resin is 100% by mass or less with respect to the entire component (A) included in the resin composition, preferably 50% by mass or less, more preferably 40% by mass or less, even more preferably 35% by mass or less, yet more preferably 30% by mass or less, and still more preferably 20% by mass or less.

(Epoxy Resin)

Epoxy resins are general monomers, oligomers, and polymers having two or more epoxy groups in one molecule and the molecular weights and molecular structures thereof are not limited.

Examples of epoxy resins include bifunctional or crystalline epoxy resins such as biphenyl epoxy resins, bisphenol A epoxy resins, bisphenol F epoxy resins, stilbene epoxy resins, and hydroquinone epoxy resins; novolac-type epoxy resins such as cresol novolac-type epoxy resins, phenol novolac-type epoxy resins, and naphthol novolac-type epoxy resins; phenol-aralkyl epoxy resins such as phenylene-skeleton-containing phenol aralkyl epoxy resins, biphenylene-skeleton-containing phenol aralkyl epoxy resins, and phenylene-skeleton-containing naphthol aralkyl epoxy resins; trifunctional epoxy resins such as triphenolmethane epoxy resins and alkyl-modified triphenolmethane epoxy resins; modified phenol epoxy resins such as dicyclopentadiene modified phenol epoxy resins and terpene modified phenol epoxy resins; heterocyclic ring-containing epoxy resins such as triazine nucleus-containing epoxy resins, and the like.

The epoxy resin preferably includes a novolac-type epoxy resin and more preferably includes a cresol novolac-type epoxy resin.

In addition, the resin composition may also include an epoxy resin and a curing agent. Examples of curing agents include phenol resin curing agents, amine-based curing agents, acid anhydride-based curing agents, mercaptan-based curing agents, and the like. Among the above, phenol resin curing agents are preferable in terms of balance of flame resistance, moisture resistance, electrical characteristics, curability, storage stability, and the like. In addition, a combination of a plurality of types of curing agents may also be used.

Specific examples of phenol resin curing agents include the various phenol resins described above.

From the viewpoint of improving the curing characteristics of the resin composition, the content of the component (A) in the resin composition is preferably 10% by mass or more with respect to the entire resin composition, more preferably 20% by mass or more, and even more preferably 30% by mass or more.

In addition, from the viewpoint of improving the adhesion to the plating film formed on the surface of the resin molded body, the content of the component (A) in the resin composition may be, for example, 99% by mass or less with respect to the entire resin composition, preferably 90% by mass or less, more preferably 80% by mass or less, even more preferably 70% by mass or less, yet more preferably 60% by mass or less, and still more preferably 50% by mass or less.

(Component (B))

Component (B) is a core-shell-type elastomer particle.

The resin composition including the component (B) together with the component (A) makes it possible to stably obtain a resin molded body having excellent adhesion to a plating film.

The component (B) is preferably soluble in acid.

In addition, the component (B) is, for example, a graft copolymer having a core-shell structure and, more specifically, formed of a rubber-like polymer forming the core and graft chains forming the shell.

The material of the core of the component (B) is, for example, a rubber-like polymer.

From the viewpoint of improving the adhesion to the plating film formed on the surface of the resin molded body, the material of the core preferably includes a butadiene (co)polymer such as polybutadiene (butadiene rubber), a styrene-butadiene copolymer (styrene-butadiene rubber: SBR), a methyl methacrylate-butadiene-styrene copolymer (MBS), and an acrylonitrile-butadiene copolymer (nitrile rubber).

In addition, examples of other materials of the core include polyisoprene (isoprene rubber), polychloroprene (chloroprene rubber), acrylic acid alkyl ester copolymers (acrylic rubber), ethylene-acrylic ester copolymers (ethylene-acrylic rubber), ethylene-propylene copolymers (ethylene-propylene rubber), epichlorohydrin (co)polymers (epichlorohydrin rubber), organosiloxane (co)polymers (silicone rubber), fluoroelastomers, natural rubbers, and materials in which hydrogen is added or partially added to the unsaturated bond portion of the above.

In addition, from the viewpoint of improving the adhesion between the resin molded body and the plating film, the material of the core preferably includes one or two or more selected from the group consisting of MBS polymers, SBR polymers, and acrylic polymers.

The material of the shell of the component (B) preferably includes a (co)polymer including a structure derived from one or two or more monomers selected from the group consisting of, for example, aromatic vinyl monomers, (meth)acrylic ester monomers, and vinyl halide monomers.

Examples of aromatic vinyl monomers include styrene compounds such as halogenated styrenes such as styrene, methyl (o-, m- or p-) styrene, ethylstyrene, isobutylstyrene, tert-butylstyrene, alkoxystyrene, and bromstyrene; and naphthalene compounds such as vinyl naphthalene.

Specific examples of (meth)acrylic ester monomers include alkyl methacrylate esters such as methyl methacrylate, ethyl methacrylate, hydroxyethyl methacrylate, propyl methacrylate, butyl methacrylate, cyclohexyl methacrylate, 2-ethylhexyl methacrylate, and octyl methacrylate; acrylic acid alkyl esters such as methyl acrylate, ethyl acrylate, propyl acrylate, butyl acrylate, cyclohexyl acrylate, 2-ethylhexyl acrylate, and octyl acrylate.

Specific examples of a vinyl halide monomer include chloroethylene.

In addition, from the viewpoint of improving the adhesion between the resin molded body and the plating film, the material of the shell preferably includes one or two or more selected from the group consisting of polycarbonate (PC), polybutylene terephthalate (PBT), polyvinyl chloride (PVC), and polymethyl methacrylate (PMMA).

In addition, examples of commercial products of the component (B) include the Kaneace M series (manufactured by Kaneka Corporation), such as Kaneace M711, Kaneace M701, Kaneace M577, and Kaneace M210; the Kaneace B series (manufactured by Kaneka Corporation), such as Kaneace B513; and the Staphyloid series (manufactured by Aica Kogyo Co., Ltd.), including the Staphyloid AC series such as the trade name "Staphyloid AC-3832" (alkyl acrylate or alkyl methacrylate copolymer fine particles), the trade name "Staphyloid AC-3816N" (alkyl acrylate or alkyl methacrylate copolymer fine particles), and the trade name "Staphyloid AC-4030" (alkyl acrylate or alkyl methacrylate copolymer fine particles).

From the viewpoint of improving the adhesion between the resin molded body and the plating film, the content of the component (B) in the resin composition is preferably 0.1% by mass or more with respect to the entire resin composition, more preferably 0.5% by mass or more, even more preferably 1% by mass or more, yet more preferably 1.5% by mass or more, and still more preferably 2.5% by mass or more.

In addition, from the viewpoint of improving the strength of the resin molded body, the content of the component (B) in the resin composition is preferably 10% by mass or less with respect to the entire resin composition, more preferably 8% by mass or less, even more preferably 6% by mass or less, and yet more preferably 4% by mass or less.

In the present embodiment, since the resin composition includes the components (A) and (B), it is possible to effectively improve the adhesion between the resin molded body and the plating film when a plating process is applied to the surface of the resin molded body formed of the cured product of the resin composition. For this reason, the resin composition of the present embodiment is suitably used to obtain a resin molded body for which a plating process is applied on a surface.

In the present embodiment, the resin composition may include components other than the components (A) and (B).

(Filler)

The resin composition may further include, for example, a filler other than the component (B). Here, examples of the shape of the filler other than the component (B) include a fibrous shape; or a granular shape such as a spherical shape.

Specific examples of fibrous shape fillers include glass fiber, carbon fiber, fibrous wollastonite, and rock wool. It is possible to set the number average fiber diameter of the fibrous shape filler to be, for example, 10 to 15 μm, and the number average fiber length to be, for example, 20 to 5000 μm. The use of such a fibrous shape filler makes it possible to improve the workability during the manufacturing of the resin composition and also to further improve the mechanical strength of the resin molded body.

In addition, specific examples of granular fillers include spherical inorganic fillers and, more specifically, include spherical glass such as glass beads and glass powder, silica such as spherical silica and crushed silica; kaolin; calcium carbonate; aluminum hydroxide; clay; and mica.

From the viewpoint of improving adhesion to the plating film formed on the surface of the resin molded body as well as improving the mechanical strength of the resin molded body, the resin composition preferably includes an inorganic filler, more preferably includes a fibrous inorganic filler, and even more preferably includes glass fibers.

From the viewpoint of improving the mechanical strength of the resin molded body, the content of the glass fibers in the resin composition is preferably 10% by mass or more with respect to the entire resin composition, more preferably 20% by mass or more, even more preferably 30% by mass or more, and yet more preferably 40% by mass or more.

In addition, from the viewpoint of improving the curing characteristics of the resin composition, the content of the filler in the resin composition is preferably 70% by mass or less with respect to the entire resin composition, more preferably 65% by mass or less, and even more preferably 60% by mass or less.

In addition, the resin composition may further include an elastomer other than the component (B). Specific examples of elastomers other than the component (B) include one or more selected from the group consisting of butadiene rubber; butadiene acrylonitrile copolymer; and modified polyvinyl alcohols such as alkyl acetalated polyvinyl alcohol.

In addition, the resin composition may also include, for example, various additives used in thermosetting resin molding materials. Specific examples of additives include mold release agents such as stearic acid, calcium stearate, magnesium stearate, carnauba wax, and polyethylene; curing aids such as magnesium oxide and calcium hydroxide (slaked lime); coloring agents such as carbon black; adhesion improvers or coupling agents to improve the adhesion between the filler and the thermosetting resin; and solvents.

The content of each of these components in the resin composition is, for example, approximately 0.1 to 5% by mass with respect to the entire resin composition.

Examples of coupling agents include one or two or more selected from various silane-based compounds such as epoxy silanes, amino silanes, phenylamino silanes, alkyl silanes, ureido silanes, vinyl silanes, and methacryl silanes, and other known coupling agents such as titanium-based compounds, aluminum chelates, and aluminum/zirconium-based compounds.

(Blending Example)
(Preparation of Resin Compositions)

For each of the blending examples, a resin composition for sealing was prepared as follows. That is, a granular molding material (thermosetting resin composition) was obtained by kneading a mixture of each component blended according to the blending amounts shown in Table 1 with heating rolls having different rotation speeds and grinding the cooled result into a sheet form. Here, for the kneading conditions of the heating rolls, the rotation speed was 20/14 rpm on the high-speed side/low-speed side, the temperature was 90/20° C. on the high-speed side/low-speed side, and the kneading time was 5 to 10 minutes.

The details of each component in Table 1 are as follows. In addition, the blending ratio of each component shown in Table 1 indicates the blending ratio (% by mass) with respect to the entire resin composition.

(A) Thermosetting Resin 1: Resol-type phenol resin, PR-53529 (manufactured by Sumitomo Bakelite Co., Ltd.)

(A) Thermosetting Resin 2: Novolac-type phenol resin, PR-51305 (manufactured by Sumitomo Bakelite Co., Ltd.)

(A) Thermosetting Resin 3: Novolac-type Phenol resin, PR-51967 (manufactured by Sumitomo Bakelite Co., Ltd.)

(A) Thermosetting Resin 4: Orthocresol-type epoxy resin, Epiclon N-670 (manufactured by DIC Corporation)

Curing aid 1: Slaked lime

Curing aid 2: 2-phenyl-4-methylimidazole, 2P4MZ (manufactured by Shikoku Chemicals Corporation)

Filler 1: Glass fiber, CS3E479 (manufactured by Nitto Boseki Co., Ltd.), number average fiber diameter 11 μm, number average fiber length 3 mm Filler 2: Crushed silica, RD-8 (manufactured by Tatsumori Ltd.), average particle diameter $d_{50}$=15 μm (B) Elastomer 1: core-shell-type, core: MBS polymer, Kaneace M701 (manufactured by Kaneka Corporation)

(B) Elastomer 2: core-shell-type, core: acrylic polymer, shell: PVC, Kaneace M577 (manufactured by Kaneka Corporation)

Elastomer 3: Butadiene acrylonitrile copolymer, TR2250 (manufactured by JSR Corporation)

Elastomer 4: Alkyl acetalated polyvinyl alcohol, ES-LEC BH-3 (manufactured by Sekisui Chemical Co., Ltd.)

Mold release agent 1: Calcium stearate, CA-ST (manufactured by Tokyo Chemical Industry Co., Ltd.)

Coloring agent 1: Carbon black, #5 (manufactured by Mitsubishi Chemical Corporation)

The following measurements were performed on the resin compositions obtained in each example. The results are shown collectively in Table 1.

(Method for Measuring Physical Properties of Resin Molded Body)

(Method for Measuring Linear Expansion Coefficient (CTE))

For the resin compositions obtained in each example, bending test pieces were molded at 175° C. for 3 minutes and then subjected to a curing process in an oven at 180° C. for 8 hours to obtain cured product test pieces. TMA measurements were carried out in the flow direction (planar direction or XY direction) and in the thickness direction (Z direction) of the obtained test pieces, respectively. The TMA measurements were carried out with a temperature rising at 5° C./min and the average linear expansion coefficient for 40° C. to 150° C. was set as α.

(Evaluation Method)
(Method for Measuring Peel Strength)

For the resin compositions obtained in each example, a molded product of 125 mm square×1.5 mm thickness was molded under conditions of 175° C. for 90 seconds to obtain a resin molded body. Thereafter, the resin molded body was subjected to a curing process in an oven at 180° C. for 8 hours and chromic acid etching was carried out on the plating film-forming surface of the obtained resin molded body to roughen the plating film-forming surface. The etching solution was an aqueous solution including chromic anhydride and sulfuric acid in the following concentrations.

(Etching Solution)
Component Concentration
Chromic anhydride 400 g/L
Sulfuric acid 400 g/L Thereafter, a 0.1 to 3 μm Ni film was formed on the etched surface of the resin molded body by electroless Ni plating, and then a 10 to 50 μm Cu film was formed by electrolytic Cu plating. The plating width was set at 10 mm. The composition of the plating solution (aqueous solution) used in each plating step is shown below.

(Plating Solution for Electroless Ni Plating)
Component Concentration
Nickel sulfate 20 g/L
Sodium hypophosphite 15 g/L
Ammonium citrate 30 g/L (Plating Solution for Electrolytic Cu Plating)
Component Concentration
Copper sulfate 200 g/L
Sulfuric acid 50 g/L The strength of the plating layer, which is the adherend, is peeled off orthogonally from the molded body obtained as described above, that is, the maximum peel strength when a 90° peel test is performed is set as the peel strength. The method for measuring the strength is as follows.

Measurement method: One end of the copper foil (adherend) is peeled off to an appropriate length and then attached to a support bracket, the tip of the peeled copper foil is gripped with a gripping tool and approximately 50 mm is continuously peeled off at a speed of approximately 50 mm per minute in the direction in which the tensile direction is orthogonal to the surface of the copper foil. The lowest value of the load during this period was set as the peel-off strength [N/cm].

(Method for Measuring Flexural Strength and Flexural Modulus)

For the resin compositions obtained in each example, bending test pieces were molded under curing conditions of 175° C. for 3 minutes in accordance with JIS K 6911, and then cured at 180° C. for 8 hours to obtain test pieces. The strength when the test pieces were broken in accordance with JIS K 6911 was used as the flexural strength. In addition, the flexural modulus was determined from the slope of the stress-strain curve in the elastic range.

TABLE 1

|  |  | Blending example 1 | Blending example 2 | Blending example 3 | Blending example 4 | Blending example 5 | Blending example 6 |
|---|---|---|---|---|---|---|---|
| Blend (% by mass) | (A) Thermosetting resin 1 | 30.2 | 30.2 | 30.2 | 29.0 | 32.5 |  |
|  | (A) Thermosetting resin 2 |  |  |  | 7.0 |  |  |

TABLE 1-continued

|  |  | Blending example 1 | Blending example 2 | Blending example 3 | Blending example 4 | Blending example 5 | Blending example 6 |
|---|---|---|---|---|---|---|---|
|  | (A) Thermosetting resin 3 | 7.8 | 7.8 | 7.8 |  | 8.4 | 5.8 |
|  | (A) Thermosetting resin 4 |  |  |  |  |  | 11.9 |
|  | Curing aid 1 | 1.1 | 1.1 | 1.1 | 1.2 | 1.1 |  |
|  | Curing aid 2 |  |  |  |  |  | 0.13 |
|  | Filler 1 | 55.1 | 55.1 | 55.1 | 54.6 | 55.2 | 20 |
|  | Filler 2 |  |  |  | 3.0 |  | 61.5 |
|  | (B) Elastomer 1 Core-shell-type | 3.0 |  |  |  |  |  |
|  | (B) Elastomer 2 Core-shell-type |  | 3.0 |  |  |  |  |
|  | Elastomer 3 |  |  | 1.5 | 2.0 |  |  |
|  | Elastomer 4 |  |  | 1.3 |  |  |  |
|  | Mold release agent 1 | 1.8 | 1.8 | 1.8 | 2.2 | 1.8 | 0.5 |
|  | Coloring agent 1 | 1.0 | 1.0 | 1.0 | 1.0 | 1.0 | 0.2 |
|  | Total | 100 | 100 | 100 | 100 | 100 | 100 |
| Peel strength | (N/cm) | 6.8 | 3.2 | 0.5 | 0.5 | 0.5 | 1.6 |
| Flexural strength | E(180° C. 8 h) (MPa) | 164 | 148 | 250 | 248 | 202 | 165 |
| Flexural modulus | E(180° C. 8 h) (GPa) | 11.5 | 10.8 | 15.5 | 16.7 | 15.2 | 18.2 |
| CTE TD/MD direction | E(180° C. 8 h) ppm/° C. | 21.6/17.8 | 24.5/16.1 | 22.1/11.5 | 24.5/10.6 | 21.3/10.5 | 18/15 |

From Table 1, in the molded bodies obtained using the resin compositions in Blending Examples 1 and 2, the peel strength of the plating film from the resin molded body was higher than that of Blending Examples 3 to 6. Accordingly, by using the resin compositions in Blending Examples 1 and 2, it is possible to improve the adhesion between the plating film and the resin molded body when the plating film is formed on the surface of the resin molded body.

In addition, the resin compositions obtained in each of the Examples also had preferable characteristics in terms of the flexural strength, flexural modulus, and linear expansion coefficient of the cured products.

Next, a description will be given of the physical properties of the resin composition or a cured product thereof.

For a cured product obtained by molding the resin composition at 175° C. for 3 minutes and then carrying out curing at 180° C. for 8 hours, from the viewpoint of improving the reliability of temperature cycling of the molded body obtained by applying a plating process to the surface of the resin molded body, the linear expansion coefficient in the planar direction (XY direction, MD) in the range of 40° C. to 150° C., as measured by thermomechanical analysis (TMA) at a temperature rise rate of 5° C./min is preferably 5 ppm/° C. or higher, more preferably 8 ppm/° C. or higher, and even more preferably 10 ppm/° C. or higher, and, for example, may be 70 ppm/° C. or lower, preferably 30 ppm/° C. or lower, more preferably 25 ppm/° C. or lower, even more preferably 20 ppm/° C. or lower, and even more preferably 18 ppm/° C. or lower.

For a cured product obtained by molding the resin composition at 175° C. for 3 minutes and then carrying out curing at 180° C. for 8 hours, from the viewpoint of improving the reliability of temperature cycling of the molded body obtained by applying a plating process to the surface of the resin molded body, the linear expansion coefficient in the thickness direction (Z direction, TD) in the range of 40° C. to 150° C., as measured by thermomechanical analysis (TMA) at a temperature rise rate of 5° C./min is preferably 5 ppm/° C. or higher, more preferably 10 ppm/° C. or higher, even more preferably 15 ppm/° C. or higher, and yet more preferably 20 ppm/° C. or higher, and, for example, may be 70 ppm/° C. or lower, preferably 35 ppm/° C. or lower, more preferably 30 ppm/° C. or lower, and even more preferably 25 ppm/° C. or lower.

For the method for manufacturing the resin composition, for example, it is possible to obtain the resin composition by mixing each of the components described above by a known unit, further carrying out melt-kneading in a kneading machine such as a roller, a kneader, or an extruder, and carrying out grinding after cooling. In addition, as necessary, a resin composition in the form of particles may be obtained by tableting and molding into tablet form after the grinding in the method described above. In addition, after the grinding in the method described above, a sheet-like resin composition may be obtained by, for example, vacuum lamination molding or compression molding. In addition, the degree of dispersion, flowability, and the like of the obtained resin composition may be adjusted as appropriate.

Here, when the resin composition includes a filler, from the viewpoint of preferable dispersibility of the raw material, preferably, the component (B) and the filler are mixed in advance and then the mixture is mixed with the component (A). More specifically, the component (B) and the filler are pre-processed and mixed in a mixer provided with rotating blades such as a Henschel mixer. At this time, the component (B), filler, and coupling agent are more preferably pre-processed and mixed.

(Resin Molded Body)

The resin molded body (molded product) is formed of the cured product of the resin composition described above.

In addition, it is possible to obtain the resin molded body by molding the resin composition described above. The molding method is preferably transfer molding or injection molding.

At this time, the conditions also depend on the thickness of the resin molded body, for example, in a case of molding a thick-walled molded product of approximately 5 mm by injection molding, it is possible to adopt conditions of a mold temperature of 170° C. to 190° C., a molding pressure of 100 to 150 MPa, and a curing time of 30 to 90 seconds.

In addition, it is possible to perform after-baking on the obtained resin molded body as necessary and to select the conditions for after-baking as appropriate for the application. For example, it is possible to set the maximum attainable temperature to from 150° C. to 270° C. and the holding time to from 1 hour to 15 hours. More preferably, it is possible to set the maximum attainable temperature to from 170° C. to 240° C. and the holding time to from 1 hour to 10 hours. The higher the temperature at which the after-baking is performed, the smaller the change in heating dimensions in the use environment tends to be.

In addition, from the viewpoint of further improving the adhesion between the resin molded body and the plating film, the resin molded body preferably has a sea-island structure, and the resin molded body more preferably has a sea-island structure in which a component (C) is present in the island phase.

Here, it is possible to confirm the sea-island structure by electron microscopic observation.

(Molded Body)

The molded body has a cured product of the resin composition described above and a plating layer provided in contact with the surface of the cured product. This molded body is used for the housing 121 (the resin molded body 101) of the inverter part 120 shown in FIG. 1.

As shown in FIG. 2 described above, a molded body 100 (the housing 121) has the resin molded body 101 formed of a cured product of a resin composition and the plating layer 103 provided in contact with the surface of the resin molded body 101. The plating layer 103 may be formed of one layer or may have a plurality of layers, for example, FIG. 2 shows a configuration in which the plating layer 103 includes the first plating layer 105 and the second plating layer 107 from the resin molded body 101 side.

In addition, the plating layer 103 is preferably provided over the entire surface of the resin molded body 101.

The methods for plating the first plating layer 105 and the second plating layer 107 may be the same or different.

From the viewpoint of improving the adhesion between the resin molded body and the plating layer 103, the first plating layer 105 is specifically an electroless plating layer. In addition, the second plating layer 107 may be an electroless plating layer or an electrolytic plating layer.

In addition, the first plating layer 105 and the second plating layer 107 are specifically metal layers, for example, these layers are independently layers including one or two or more selected from the group consisting of Cu, Ni, Al, Fe, Au, and alloys thereof.

From the viewpoint of improving the adhesion between the resin molded body and the plating layer 103, preferably, one of the first plating layer 105 and the second plating layer 107 is a Ni film and the other is a Cu film.

From the viewpoint of improving the adhesion between the resin molded body 101 and the plating layer 103, the resin molded body 101 preferably has a roughened layer on the bonding surface with the plating layer 103 and the plating layer 103 is provided in an inner part of a recess provided in the roughened layer.

From the viewpoint of improving the adhesion to the second plating layer 107 and improving the electromagnetic wave shielding property, the thickness of the first plating layer 105 is preferably 0.1 μm or more and more preferably 0.3 μm or more and preferably 5 μm or less and more preferably approximately 3 μm.

From the viewpoint of improving the electromagnetic wave shielding property, the thickness of the second plating layer 107 is preferably 0.5 μm or more and more preferably 1 μm or more and preferably 50 μm or less and more preferably 30 μm or less.

In addition, from the viewpoint of improving the electromagnetic wave shielding property, the thickness of the entire plating layer 103 is preferably 0.1 μm or more and more preferably 0.5 μm or more and preferably 60 μm or less and more preferably 30 μm or less.

(Plating Layer Suitable for Case Demanding High Electromagnetic Wave Shielding Property)

Here, as shown in FIG. 1, in a case where there is demand for a high electromagnetic wave shielding property, such as a case where the molded body 100 is applied to the housing 121 of the inverter part 120, the plating layer 103 is preferably formed as follows. That is, from the viewpoints of both the electromagnetic wave shielding property and weather resistance (anti-corrosion function), preferably, in FIG. 2, the first plating layer 105 on the resin molded body 101 side is a Cu film (Cu layer) and the second plating layer 105 on the outside is a Ni film (Ni layer). That is, a Cu film which contributes to the electromagnetic wave shielding property is used as the first plating layer 105 and an Ni layer which has high anti-corrosion properties is used as the second plating layer 107.

At this time, the thicknesses of the first plating layer 105 (Cu layer) and the second plating layer 107 (Ni layer) preferably satisfy the following values. That is, the first plating layer 105 (Cu layer) is preferably 1.5 μm or more, more preferably 2 μm or more, and even more preferably 2.5 μm or more and preferably 60 μm or less and more preferably 30 μm or less.

The thickness of the second plating layer (Ni layer) is preferably 0.1 μm or more and more preferably 0.3 μm or more and preferably 30 μm or less and more preferably 20 μm or less. Due to this, it is possible to realize a high electromagnetic wave shielding property.

(Effect of Embodiment (Electromagnetic Shielding Property))

A description will be given of the specific electromagnetic wave shielding property values using the Examples described below; however, in the case of single-sided plating as shown in FIG. 2, it is possible to realize a magnetic field wave shielding property of 40 dB or more (99% or more blocked) at a magnetic field wave frequency of 10 MHz and 60 dB or more (99.9% or more) at a frequency of 100 MHz. It is possible to realize an electric field wave shielding property of 60 dB or more (99.9% or more) for both 10 MHz and 100 MHz frequencies of electric field waves.

(Another Example of Plating Layer Exhibiting High Electromagnetic Wave Shielding Property)

Figure 3:
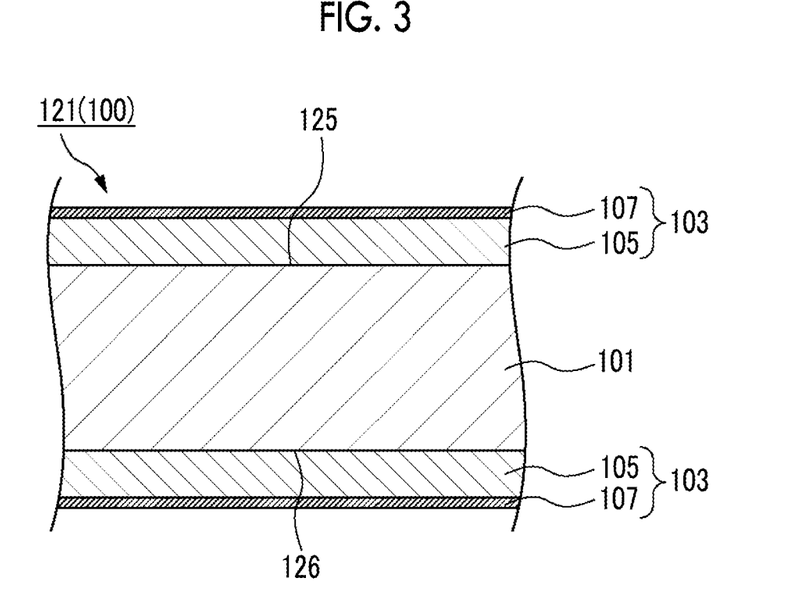
FIG. 3 is a diagram of another example of an enlarged view of a partial region of the housing shown in FIG. 2.

FIG. 3 is a cross-sectional view of another example of an enlarged view of a partial region A1 of the housing 121 shown in FIG. 2 and shows a case in which the plating layers 103 are provided on both surfaces of the outer surface 125 and an inner surface 126 of the resin molded body 101 (a case of double-sided plating). In a case of double-sided plating, it is possible to realize shielding properties equivalent to the measurement limit for both magnetic field waves and electric field waves. That is, for both magnetic field wave and electric field wave shielding properties, it is possible to realize 60 dB or more (99.9% or more blocking) at a frequency of 10 MHz or higher.

Figure 4:
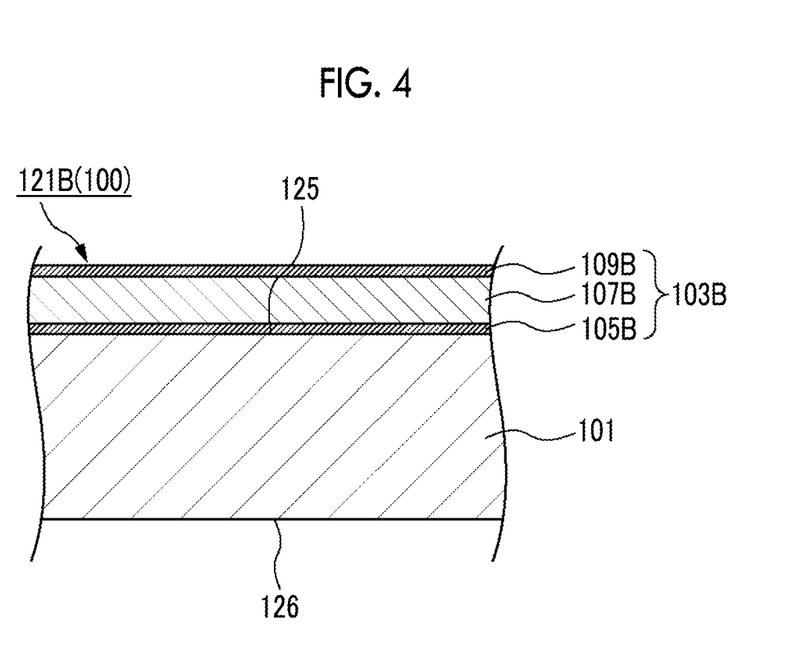
FIG. 4 is a diagram of yet another example of an enlarged view of a partial region of the housing shown in FIG. 2.

FIG. 4 is a cross-sectional view of yet another example of an enlarged view of a partial region A1 of the housing 121 shown in FIG. 2. A housing 121B in FIG. 4 has a three-layer plating layer 103B on the outer surface 125 of the resin molded body 101. That is, the plating layer 103B has a first plating layer 105B, a second plating layer 107B, and a third plating layer 109B in order from the resin molded body 101 side.

An example of the plating layer 103B is as follows. That is, the first plating layer 105B is a Ni film (Ni layer). The thickness of the first plating layer 105B is, for example, 0.25 μm.

The second plating layer 107B is a Cu film (Cu layer). The thickness of the second plating layer 107B is, for example, 5 μm.

The third plating layer 109B is a permalloy film (permalloy layer). The thickness of the third plating layer 109B is, for example, 5 μm. Permalloy is an alloy for which the main components are Ni and Fe.

Instead of the permalloy film (permalloy layer) forming the third plating layer 109B, two plating layers of an Ni film (Ni layer) and a Cr film (Cr layer) (not shown) may be formed from the second plating layer 109B side. At this time, for example, the thickness of the Ni film (Ni layer) is 5 μm and the thickness of the Cr film (Cr layer) is 0.15 μm.

The above is an example of the plating layer 103 in a case where there is a demand for a high electromagnetic wave shielding property, such as in the inverter part 120.

(Method for Manufacturing Molded Body)

Next, a description will be given of the method for manufacturing the molded body 100. The method for manufacturing a molded body includes, for example, a step of preparing a cured product of the resin composition described above, that is, the resin molded body 101, a step of etching and roughening the surface of the resin molded body 101, and a step of forming the plating layer 103 on the roughened surface.

The step of etching and roughening the surface of the resin molded body 101 is specifically a step in which the surface on which the plating layer 103 is to be formed is etched prior to the plating process to dissolve and remove calcium carbonate present in the vicinity of the surface of the resin molded body 101 and form a roughened layer provided with unevenness on the surface. In addition, when the resin molded body 101 includes an elastomer which dissolves in the etching solution, the elastomer present in the vicinity of the surface of the resin molded body 101 is preferably removed together with the calcium carbonate.

Examples of the etching method include acid processing. Specific examples of acids used in the acid processing include chromic acid, sulfuric acid, and the like. For example, in a case where the acid used is chromic acid only, it is possible to appropriately set the etching conditions according to the type of components such as the thermosetting resin included in the resin molded body 101, for example.

In addition, after the acid processing and before forming the plating layer 103, it is preferable to neutralize the surface of the resin molded body 101 by washing.

In addition, in the step of forming the plating layer 103, the first plating layer 105 and the second plating layer 107 are formed sequentially using a known method according to the type of metal forming the plating film and the plating method. For example, a seed layer is formed on the roughened surface of the resin molded body 101 and the metal film is grown using the seed layer as a base point.

In the present embodiment, since a roughened layer is formed on the resin molded body 101, it is possible to form the first plating layer 105 in which a plating film is filled in an inner part of a recess provided in the roughened layer. For this reason, it is possible to obtain the plating layer 103 having excellent adhesion to the resin molded body 101.

Through the above, it is possible to obtain the molded body 100 shown in FIG. 2.

There is no limitation on the applications of the molded body 100 obtained in the present embodiment and development is possible for various applications, for example, use is possible for aircraft parts, automotive parts, parts for electronic devices, parts for household electrical appliances, parts for industrial devices, and the like.

In particular, it is possible to suitably use the molded body 100 for members in which the plating layer 103 functions as a heat diffusing member, members in which the plating layer 103 functions as an electromagnetic wave shield, or the like, for example, use is also possible in components of inverters, components of air conditioners, components of electric motors, control components of automobiles (ECU control devices), and the like.

Description was given of the embodiments of the present invention, but the above are examples of the present invention and it is also possible to adopt various configurations other than the above.

EXAMPLES

A detailed description will be given below of the present embodiment with reference to Examples and Comparative Examples. The present embodiment is not limited in any way to the descriptions of these Examples.

With reference to Table 2 and Table 3, a description will be given of Examples relating to the configuration and electromagnetic shielding properties of the plating layer 103.

Table 2 shows the blending amount, plating level, and the like of the resin molded bodies of Examples 1 to 4 and Comparative Examples 1 to 3. The details of each component in Table 2 are the same as the details of each component in Table 1.

Table 3 shows the measurement results relating to the electromagnetic wave sealing performance of the resin molded bodies of Examples 1 to 4 and Comparative Examples 1 to 3.

(Overview of Molded Products having Plating Layer and Molded Products of Comparative Examples)

In Examples 1 to 4, as shown in Table 2, an electromagnetic shielding plating layer was formed on a resin molded body (cured body of phenol resin composition). As the components of the resin molded body, the components shown in Blending Example 1 in Table 1 were adopted.

Example 1 is an example of double-sided plating with two layers of a 2.5 μm Cu film and a 0.3 μm Ni film from the resin molded body 101 as the plating layer 103.

Example 2 is an example of single-sided plating with two layers of a 2.5 μm Cu film and a 0.3 μm Ni film from the resin molded body 101 as the plating layer 103.

Example 3 is an example of double-sided plating with four layers of a 0.25 μm Ni film, a 5 μm Cu film, a 5 μm Ni film, and a 0.15 μm Cr film from the resin molded body 101 as the plating layer 103.

Example 4 is an example of double-sided plating with three layers of a 0.25 μm Ni film, a 5 μm Cu film, and a 5 μm permalloy film from the resin molded body 101 as the plating layer 103.

Comparative Example 1 is an example of double-sided coating applied to a resin molded body of Comparative Example 3.

Comparative Example 2 is an example of single-sided coating applied to the resin molded body of Comparative Example 3.

Comparative Example 3 is an example of a phenol resin (a resin molded body without a plating layer).

For Examples 1 and 2, the electric field waves, magnetic field waves, and electromagnetic field waves were measured. For Examples 3 and 4, only the electromagnetic field waves were measured. For Comparative Examples 1 to 3, the electric field waves and magnetic field waves were measured.

In addition, in Examples 1 and 2, in a case where a Cu layer was provided directly on the resin molded body 101, a Cu seed layer was formed on the resin molded body 101 and a Cu layer was formed thereon by electrolytic plating.
(Sample Creation Method)

Sample for measuring electric field wave and magnetic field wave shielding performance: a 125 mm square×1.5 mm thick molded product, which was molded at 175° C. for 1 min, was used.

Sample for measuring electromagnetic field wave shielding performance: an 80 mm×50 mm×0.9 mm thick molded product, which was molded at 175° C. for 3 min, was processed to be 5 mm square×0.9 mm thick and used.
(Method for Measuring Electromagnetic Wave Shielding Performance)

Measurements of the electric field wave and magnetic field wave shielding performances were carried out in accordance with the KEC method and the electromagnetic field waves were measured in accordance with a method known as the GHz KEC method.
(Flexural Strength Measurement Method)

A JIS bending test piece was molded at 175° C. for 3 min and the strength when the test piece was broken by a method in accordance with JIS K 6911 was set as the flexural strength.
(Method for Measuring Linear Expansion Coefficient (CTE)α)

A JIS bending test piece was molded at 175° C. for 3 min and cured at 180° C. for 8 hours to obtain a test piece, and TMA measurement was carried out in the flow direction. The TMA measurement in the flow direction was carried out with a temperature rising at 5° C./min and the average linear expansion coefficient for 40° C. to 150° C. was set as α.

TABLE 2

| | | Example 1 | Example 2 | Example 3 | Example 4 | Comparative example 1 | Comparative example 2 | Comparative example 3 |
|---|---|---|---|---|---|---|---|---|
| Level | | Double-sided plating | Single-sided plating | Double-sided plating | Double-sided plating | Double-sided coating | Single-sided coating | Phenol resin molded product |
| Plating content | | Cu2.5 μm + Ni0.3 μm | Cu2.5 μm + Ni0.3 μm | Ni0.25 μm + Cu0.5 μm + Ni5 μm + Cr0.15 μm | Ni0.25 μm + Cu5 μm + Permalloy 5 μm | | | |
| Blend (% by mass) | (A) Thermosetting resin 1 | 30.2 | 30.2 | 30.2 | 30.2 | 29.0 | 29.0 | 29.0 |
| | (A) Thermosetting resin 2 | | | | | 7.0 | 7.0 | 7.0 |
| | (A) Thermosetting resin 3 | 7.8 | 7.8 | 7.8 | 7.8 | | | |
| | Curing aid 1 | 1.1 | 1.1 | 1.1 | 1.1 | 1.2 | 1.2 | 1.2 |
| | Filler 1 | 55.1 | 55.1 | 55.1 | 55.1 | 54.6 | 54.6 | 54.6 |
| | Filler 2 | | | | | 3.0 | 3.0 | 3.0 |
| | (B) Elastomer 1 Core-shell-type | 3.0 | 3.0 | 3.0 | 3.0 | | | |
| | Elastomer 3 | | | | | 2.0 | 2.0 | 2.0 |
| | Mold release agent 1 | 1.8 | 1.8 | 1.8 | 1.8 | 2.2 | 2.2 | 2.2 |
| | Coloring agent 1 | 1.0 | 1.0 | 1.0 | 1.0 | 1.0 | 1.0 | 1.0 |
| | Total | 100 | 100 | 100 | 100 | 100 | 100 | 100 |
| Peel strength | (N/cm) | 6.8 | 6.8 | 6.8 | 6.8 | 0.5 | 0.5 | 0.5 |
| Flexural strength | E(180° C. 8 h) (MPa) | 164 | 164 | 164 | 164 | 248 | 248 | 248 |
| Flexural modulus | E(180° C. 8 h) (GPa) | 11.5 | 11.5 | 11.5 | 11.5 | 16.7 | 16.7 | 16.7 |
| CTE TD/MD direction | E(180° C. 8 h) ppm/° C. | 21.6/17.8 | 21.6/17.8 | 21.6/17.8 | 21.6/17.8 | 24.5/10.6 | 24.5/10.6 | 24.5/10.6 |

TABLE 3

| | | Example 1 | Example 2 | Example 3 | Example 4 | Comparative example 1 | Comparative example 2 | Comparative example 3 | Measurement limit |
|---|---|---|---|---|---|---|---|---|---|
| Electromagnetic shielding performance | Electric field waves | | | | | | | | |
| | 10 MHz(dB) | 74.2 | 74.0 | | | 73.7 | 66.1 | 1.0 | 72.9 |
| | 100 MHz(dB) | 92.8 | 93.0 | | | 75.2 | 47.5 | 1.0 | 92.7 |
| | 500 MHz(dB) | 101.9 | 102.1 | | | 46.8 | 33.4 | 0.8 | 106.8 |
| | 1000 MHz(dB) | 102.8 | 104.5 | | | 44.5 | 28.8 | 1.3 | 110.8 |
| | Magnetic field waves | | | | | | | | |
| | 10 MHz(dB) | 62.3 | 50.0 | | | 1.6 | 1.5 | 1.3 | 62.6 |
| | 100 MHz(dB) | 76.8 | 76.8 | | | 5.6 | 2.3 | 1.1 | 81.7 |
| | 500 MHz(dB) | 94.0 | 93.7 | | | 18.3 | 9.4 | 1.1 | 94.1 |
| | 1000 MHz(dB) | 94.6 | 94.7 | | | 27.7 | 13.9 | 0.9 | 95.5 |

TABLE 3-continued

|  | Example 1 | Example 2 | Example 3 | Example 4 | Comparative example 1 | Comparative example 2 | Comparative example 3 | Measurement limit |
|---|---|---|---|---|---|---|---|---|
| Electromagnetic field waves |  |  |  |  |  |  |  |  |
| 1000 MHz(dB) | 110.3 | 83.6 | 65.7 | 87.1 |  |  |  | 111.1 |
| 3000 MHz(dB) | 105.0 | 84.0 | 44.7 | 86.9 |  |  |  | 104.9 |
| 6000 MHz(dB) | 102.1 | 84.8 | 54.2 | 101.1 |  |  |  | 102.3 |

As shown in the measurement results in Table 3, for Comparative Examples 1 to 3 without a plating process, there are no examples able to satisfy a blocking ratio of 99% or higher under all conditions. For example, Comparative Example 1 (double-sided coating) was 40 dB or more (blocking ratio of 99% or more) for electric field waves but 30 dB or less for magnetic field waves. This is insufficient for recent market demands as the electromagnetic wave shielding property. In Comparative Example 2 (single-sided coating), the level for electric field waves is slightly higher than 40 dB at 10 MHz and 100 MHz, which is insufficient for the electromagnetic wave shielding performance.

On the other hand, Examples 1 to 4, to which a plating process is applied, exhibit an extremely high electromagnetic shielding property. For example, the results of Example 1 (double-sided plating) are values almost equal to the measurement limit under all conditions. That is, there was an extremely high electromagnetic wave shielding performance. Even under the conditions of Example 2 (single-sided plating), although the value does not reach 60 dB (99.9% blocking) at magnetic field waves of 10 MHz, the electromagnetic wave shielding performance is sufficiently high at 50.0 dB which is 99% blocking (40 dB) or more And, under other conditions, the electromagnetic wave shielding property is extremely high at 60 dB or more.

This application claims priority based on Japanese Application JP 2019-232496 filed on Dec. 24, 2019, the entire disclosure of which is incorporated herein.

REFERENCE SIGNS LIST

100: Molded body
101: Resin molded body
103: Plating layer
105, 105B: First plating layer
107, 107B: Second plating layer
109B: Third plating layer
120: Inverter part
121, 121B: Housing
123: Inverter circuit
125: Outer surface
126: Inner surface

The invention claimed is:

1. An electromagnetic wave shielding housing comprising:
a cured product of a thermosetting resin composition, wherein the thermosetting resin composition is phenol resin composition; and
a plating layer provided on a surface of the cured product, wherein the phenol resin composition includes the following components (A) and (B);
(A) a phenol resin including a resol-type phenol resin and a novolac-type phenol resin, and
(B) core-shell-type elastomer particles,
the plating layer includes a Cu layer, and
a thickness of the Cu layer is 2 μm or more and 30 μm or less.

2. The electromagnetic wave shielding housing according to claim 1,
wherein, for the cured product obtained by molding and then curing the thermosetting resin composition, a linear expansion coefficient in a range of 40° C. to 150° C., as measured by thermomechanical analysis at a temperature rise rate of 5° C./min, is 5 ppm/° C. or more and 25 ppm/° C. or less.

3. The electromagnetic wave shielding housing according to claim 1,
wherein a flexural strength of the cured product of the thermosetting resin composition is 140 MPa or more.

4. The electromagnetic wave shielding housing according to claim 1,
wherein a 90° peel strength of the cured product of the thermosetting resin composition measured by a 90° peel under the following conditions is 4 N/cm or more
peel speed: 50 mm/min
adherend: copper foil.

5. The electromagnetic wave shielding housing according to claim 1,
wherein the plating layer includes a Ni-containing plating layer provided outside the Cu layer in a lamination direction.

6. The electromagnetic wave shielding housing according to claim 5,
wherein a thickness of the Ni-containing plating layer is 0.3 μm or more and 20 μm or less.

7. The electromagnetic wave shielding housing according to claim 1,
wherein the plating layer includes a permalloy layer provided outside the Cu layer in a lamination direction.

8. The electromagnetic wave shielding housing according to claim 1,
wherein the plating layer includes a Ni-containing plating layer between the Cu layer and the cured product.

9. The electromagnetic wave shielding housing according to claim 1,
wherein an electromagnetic wave shielding performance due to a structure with the cured product and the plating layer provided on the surface of the cured product is 40 dB or more at a frequency of 10 MHz.

10. The electromagnetic wave shielding housing according to claim 1,
wherein an electromagnetic wave shielding performance due to a structure with the cured product and the plating layer provided on the surface of the cured product is 60 dB or more at a frequency of 100 MHz.

11. An inverter part comprising:
the electromagnetic wave shielding housing according to claim 1.

12. An air conditioner part comprising:
the electromagnetic wave shielding housing according to claim 1.

13. An automotive part comprising:
the electromagnetic wave shielding housing according to claim 1.

14. An electromagnetic wave shielding housing comprising:
a cured product of a thermosetting resin composition, wherein the thermosetting resin composition is phenol resin composition; and
a plating layer laminated on a surface of the cured product,
wherein the phenol resin composition includes the following components (A) and (B);
(A) a phenol resin including a resol-type phenol resin and a novolac-type phenol resin, and
(B) core-shell-type elastomer particles, and
an electromagnetic wave shielding performance due to a structure with the cured product and the plating layer is 40 dB or more at a frequency of 10 MHz.

15. The electromagnetic wave shielding housing according to claim 14,
wherein the electromagnetic wave shielding performance due to the structure with the cured product and the plating layer is 60 dB or more at a frequency of 100 MHz.

\* \* \* \* \*